(12) United States Patent
Chen

(10) Patent No.: US 11,462,473 B2
(45) Date of Patent: Oct. 4, 2022

(54) ELECTRICALLY PROGRAMMABLE FUSE STRUCTURE AND SEMICONDUCTOR DEVICE

(71) Applicant: Changxin Memory Technologies, Inc., Anhui (CN)

(72) Inventor: Main-Gwo Chen, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 97 days.

(21) Appl. No.: 17/007,220

(22) Filed: Aug. 31, 2020

(65) Prior Publication Data

US 2020/0402908 A1 Dec. 24, 2020

Related U.S. Application Data

(63) Continuation of application No. PCT/CN2019/077500, filed on Mar. 8, 2019.

(30) Foreign Application Priority Data

Mar. 8, 2018 (CN) .......................... 201810189694.6

(51) Int. Cl.
*H01L 23/52* (2006.01)
*H01L 23/525* (2006.01)
*G11C 17/16* (2006.01)

(52) U.S. Cl.
CPC .......... *H01L 23/5256* (2013.01); *G11C 17/16* (2013.01)

(58) Field of Classification Search
CPC .... H01L 23/5256; H01H 85/055; G11C 17/16
(Continued)

(56) References Cited

U.S. PATENT DOCUMENTS

2005/0224910 A1* 10/2005 Kuno .................. H01L 23/5256
257/E23.149
2006/0108662 A1* 5/2006 Kothandaraman .........................
H01L 23/5256
257/E23.149

(Continued)

FOREIGN PATENT DOCUMENTS

CN 102157491 A 8/2011
CN 103872011 A 6/2014
(Continued)

OTHER PUBLICATIONS

PCT International Search Report and the Written Opinion dated Jun. 10, 2019, issued in related International Application No. PCT/CN2019/077500 (7 pages).
(Continued)

*Primary Examiner* — Brook Kebede
(74) *Attorney, Agent, or Firm* — Sheppard Mullin Richter & Hampton LLP

(57) ABSTRACT

An electrically programmable fuse structure and a semiconductor device are disclosed. The electrically programmable fuse structure comprises a cathode, a fuse link and an anode, the fuse link connecting the cathode to the anode, the cathode connected to the fuse link at a junction, wherein the cathode comprises a plurality of conductive branches arranged to form a converging side and a diverging side, and the converging side of the cathode is connected to the junction so as to be connected to the fuse link.

20 Claims, 5 Drawing Sheets

(58) Field of Classification Search
USPC .......................................................... 257/529
See application file for complete search history.

(56) References Cited

U.S. PATENT DOCUMENTS

| | | | |
|---|---|---|---|
| 2006/0197179 A1 | 9/2006 | Park et al. | |
| 2007/0029576 A1* | 2/2007 | Nowak | H01L 27/10 257/209 |
| 2007/0284693 A1* | 12/2007 | Kim | H01L 23/5256 257/529 |
| 2008/0258255 A1* | 10/2008 | Ker | H01L 23/5256 257/E23.141 |
| 2009/0001506 A1* | 1/2009 | Kim | H01L 23/5256 257/E23.149 |
| 2009/0206978 A1* | 8/2009 | Hwang | G11C 17/16 337/295 |
| 2009/0231900 A1* | 9/2009 | Kim | G11C 17/16 365/96 |
| 2009/0243032 A1* | 10/2009 | Chen | H01L 23/5256 257/E23.149 |
| 2009/0267723 A1* | 10/2009 | Hwang | H01L 23/5256 337/290 |
| 2009/0302417 A1* | 12/2009 | Kim | H01L 23/5256 257/E23.149 |
| 2010/0038747 A1 | 2/2010 | Chanda et al. | |
| 2011/0101493 A1* | 5/2011 | Wu | H01L 23/5256 257/E23.149 |
| 2012/0154102 A1* | 6/2012 | Chen | H01L 23/5256 337/290 |
| 2013/0062726 A1* | 3/2013 | Kurz | H01L 23/5256 257/E29.325 |
| 2016/0035527 A1* | 2/2016 | Hung | H01L 23/5256 337/186 |
| 2017/0047287 A1* | 2/2017 | Choi | H01L 23/5226 |
| 2018/0301411 A1* | 10/2018 | Kim | H01L 23/5256 |

FOREIGN PATENT DOCUMENTS

| | | |
|---|---|---|
| CN | 105097772 A | 11/2015 |
| CN | 108493182 A | 9/2018 |

OTHER PUBLICATIONS

First Search dated Dec. 12, 2018, issued in related Chinese Application No. 201810189694.6 (1 page).

First Office Action dated Dec. 25, 2018, issued in related Chinese Application No. 201810189694.6, with English machine translation (7 pages).

* cited by examiner

US 11,462,473 B2

ELECTRICALLY PROGRAMMABLE FUSE STRUCTURE AND SEMICONDUCTOR DEVICE

CROSS-REFERENCE TO RELATED APPLICATIONS

This application is a continuation application of International Patent Application No. PCT/CN2019/077500, filed on Mar. 8, 2019, which is based on and claims priority of Chinese Patent Application No. 201810189694.6, filed with the State Intellectual Property Office (SIPO) of the People's Republic of China on Mar. 8, 2018. The above-referenced applications are incorporated herein by reference in their entirety.

TECHNICAL FIELD

The present disclosure relates to semiconductor technology and, in particular, to an electrically programmable fuse structure and a semiconductor device.

BACKGROUND

In semiconductor technology, a conventional fuse is typically designed to be vaporized at a high temperature generated from laser. To this end, it is necessary for such conventional fuse to be partially exposed so as to create a channel for discharging the vaporized material during the laser treatment. However, the exposure also poses the fuse to the risk of contamination, which can affect the performance and consistency of the laser-blown fuse. In addition, the laser treatment requires the use of a laser device, which put a limit on how small the size of the fuse can be. Furthermore, as the size of semiconductor devices continues to shrink, the operation of such laser device is becoming increasingly difficult. Therefore, with the continuous advancement of semiconductor technology, it is harder and harder for conventional laser-blown fuses to meet the requirements of ever-shrinking semiconductor devices. For this reason, electrically programmable fuses (e-fuses) have been proposed.

FIG. 1 is a schematic illustration of an electrically programmable fuse structure. As shown in FIG. 1, the electrically programmable fuse structure typically includes a cathode 10, an anode 30 and a fuse link 20. The fuse link 20 is connected between the cathode 10 and the anode 30. During programming, a large electrical current is applied to the fuse link 20 between the cathode 10 and the anode 30 to blow the fuse link 20 through the action of electromigration. Blowing the electrically programmable fuse in such a manner, i.e., by electromigration, allows the device to be made small and easy to operate.

However, the overall design of the existing electrically programmable fuse must be strictly controlled. For example, the size of the fuse link 20 must be precisely controlled. Otherwise, current and time cannot be properly controlled during programming, which can lead to the rupture of the fuse link 20 due to excessive temperature. In other words, before the fuse link 20 blows by electromigration, the temperature of the fuse link 20 reaches a critical temperature and thus causes the fuse link 20 to rupture. The rupture of the fuse link 20 may cause damage to its surrounding components, films or layers. For example, as shown in FIG. 1, when the fuse link 20 ruptures, damages caused by the rupture may extend to the cathode 10 and the anode 30.

SUMMARY

The present disclosure provides an electrically programmable fuse structure, so as to overcome the problem of thermal rupture of the fuse link during programming and its adverse consequences on its surrounding components, often found in existing electrically programmable fuse structures.

The electrically programmable fuse structure includes a cathode, a fuse link and an anode. The fuse link connects the cathode to the anode, and the cathode is connected to the fuse link at a junction. Additionally, the cathode includes a plurality of conductive branches arranged to form a converging side and a diverging side, and the converging side is connected to the junction so as to be connected to the fuse link.

In some embodiments, during programming of the electrically programmable fuse structure, electron flows in the plurality of conductive branches converge at the junction connecting the cathode and the fuse link and enter the fuse link.

In some embodiments, the cathode may include a power terminal (S) configured to be connected to a power source, and the power terminal is provided on one of the plurality of conductive branches farthest from the junction (P) in a direction of the electron flows.

In some embodiments, at least two of the plurality of conductive branches in the cathode are connected to the junction, and electron flows in the at least two conductive branches converge at the junction (P) during programming of the electrically programmable fuse structure.

In some embodiments, the plurality of conductive branches in the cathode may be divided into N branch groups where N is a positive integer greater than or equal to 1, where conductive branches in the first branch group are connected to the junction, and conductive branches in the N-th branch group are connected to conductive branches in the (N−1)-th branch group, so that during programming of the electrically programmable fuse structure, electron flows pass from the conductive branches in the N-th branch group through the conductive branches in the (N−1)-th branch group step by step to enter the conductive branches in the first branch group, and converge at the junction.

In some embodiments, the number of the conductive branches in the N-th branch group is greater than the number of the conductive branches in the (N−1)-th branch group so that during programming of the electrically programmable fuse structure, an electron flow density is increased stepwise from the N-th branch group to the first branch group in the N branch groups.

In some embodiments, the plurality of conductive branches in the cathode may be all connected to the junction and extend radially away from the fuse link.

In some embodiments, the cathode may have an effective width gradually decreasing in a direction of electron flows toward the junction so that during programming of the electrically programmable fuse structure, an electron flow density is increased stepwise along the direction of the electron flows toward the junction, where the effective width of the cathode is a total of widths of the portions of the cathode which contain electron flows.

In some embodiments, the plurality of conductive branches in the cathode may form a mesh structure, the number of openings of the mesh structure decreasing in a direction toward the junction.

In some embodiments, the openings in the mesh structure may be rectangular or rhombic, and a vertex of an opening in the mesh structure closest to the junction couples to the junction.

In some embodiments, the openings in the mesh structure may be rectangular or rhombic, and a shortest diagonal of the openings in the mesh structure has a length greater than or equal to four times a specified minimum line pitch.

In some embodiments, the plurality of conductive branches in the cathode may form a comb-like structure.

In some embodiments, the cathode may be a symmetrical structure of which an axis of symmetry may be along a longitudinal direction of the fuse link.

In some embodiments, the cathode and the fuse link may be formed in different layers; the cathode is electrically connected to the fuse link at the junction by a conductive plug; and during programming of the electrically programmable fuse structure, electron flows in the cathode enter the fuse link through the conductive plug.

In some embodiments, the conductive plug may be further connected to a power terminal.

In some embodiments, the cathode and the fuse link may be formed in a sane layer, and the cathode and the fuse link are physically connected to each other.

In some embodiments, at least two adjacent ones of the plurality of conductive branches form an angle of greater than 0° and smaller than or equal to 90° at the junction on the converging side.

In some embodiments, the fuse link may have a width that is smaller than or equal to a width of the plurality of conductive branches and greater than or equal to a specified minimum line width.

In some embodiments, the plurality of conductive branches may be continuous and linear, and each of the plurality of conductive branches has an electron flow permissible value constant throughout the conductive branch.

In some embodiments, a width of each of the plurality of conductive branches may be greater than or equal to twice a specified minimum line width.

In some embodiments, a length of each of the plurality of conductive branches may be greater than or equal to four times a specified minimum line width.

Based on the electrically programmable fuse structure as provided above, the present disclosure also provides a semiconductor device including this electrically programmable fuse structure.

In some embodiments, the semiconductor device may be a memory. In some embodiments, the memory may include a memory cell to which the electrically programmable fuse structure is electrically connected. Alternatively, the electrically programmable fuse structure may constitute a part of the memory cell.

In the electrically programmable fuse structure of the present disclosure, the cathode has multiple conductive branches used to divide an electron flow into multiple flows, enabling the cathode to withstand a greater electron flow. As a result, when electron flows in the individual conductive branches converge at the junction, a greater electron flow density gradient may be achieved there. Accordingly, the fuse link may have an increased electromigration rate and thus blow in a shorter time through the action of electromigration at a portion near the junction with an effectively reduced risk of rupture due to an excessive temperature.

In addition, compared to conventional fuse structures, the fuse structure of the present disclosure can generate a greater electron flow density gradient around the junction, accelerating electromigration in the portion of the fuse link near the junction. Moreover, the multiple conductive branches in the cathode of the fuse structure can also facilitate heat dissipation of the cathode, resulting in a lower temperature thereof and hence a greater temperature gradient around the junction connecting the cathode and the fuse link, which can further speed up electromigration. Under the joint effect of both the greater electron flow density gradient and greater temperature gradient, the fuse link can blow at the portion near the junction in an even shorter time.

LIST OF REFERENCE NUMERALS IS PROVIDED AS FOLLOWS

10: Cathode
20: Fuse Link
30: Anode
100/100': Cathode
110/110': Conductive Branch
110a/110a': First Branch Group
110b/110b': Second Branch Group
110c: Third Branch Group
200: Fuse Link
300: Anode
400: Conductive Plug
P: Junction
S: Power Terminal
W: Width of Conductive Branch
L: Length of Conductive Branch
D: Length of Shortest Diagonals of Openings in Mesh Structure

DETAIL DESCRIPTION OF THE EMBODIMENTS

Electrically programmable fuse structures and semiconductor devices according to embodiments of the present disclosure will be described in greater detail below with reference to the accompanying drawings. Advantages and features of the disclosure will be more readily apparent from the following description. The figures are provided in a very simplified form not necessarily presented to scale, with the mere intention to facilitate convenience and clarity in describing the embodiments.

Figure 1:
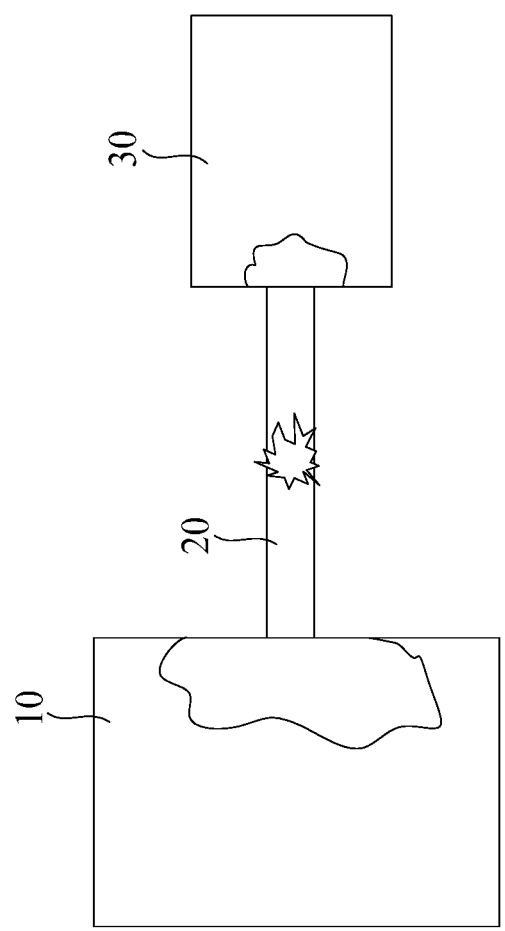
FIG. 1 is a schematic illustration of an electrically programmable fuse structure.
Figure 2A:
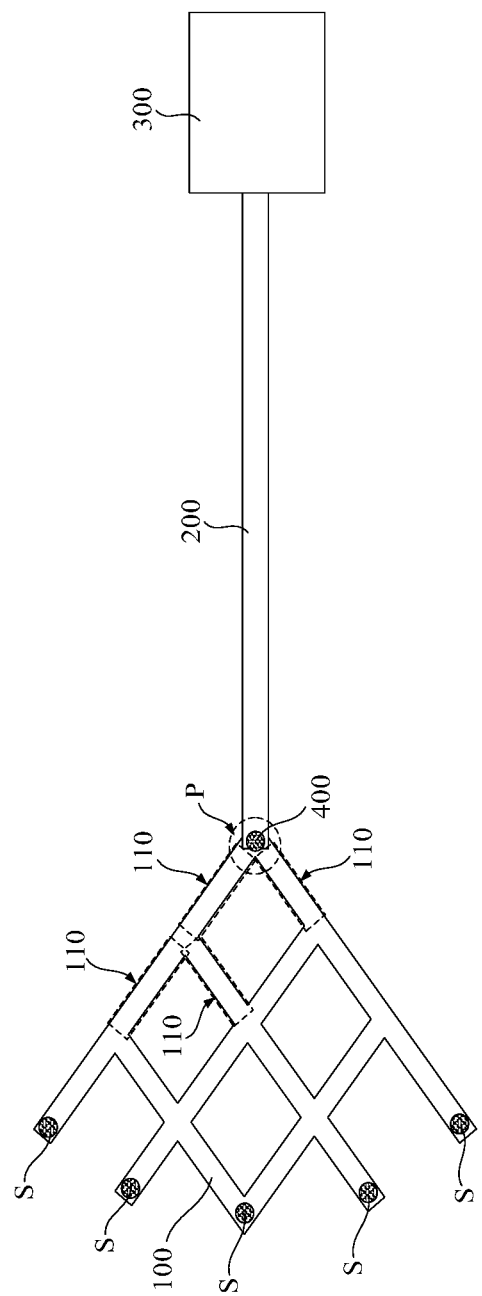
FIG. 2A schematically illustrates an electrically programmable fuse structure according to some embodiments of the present disclosure.
Figure 2B:
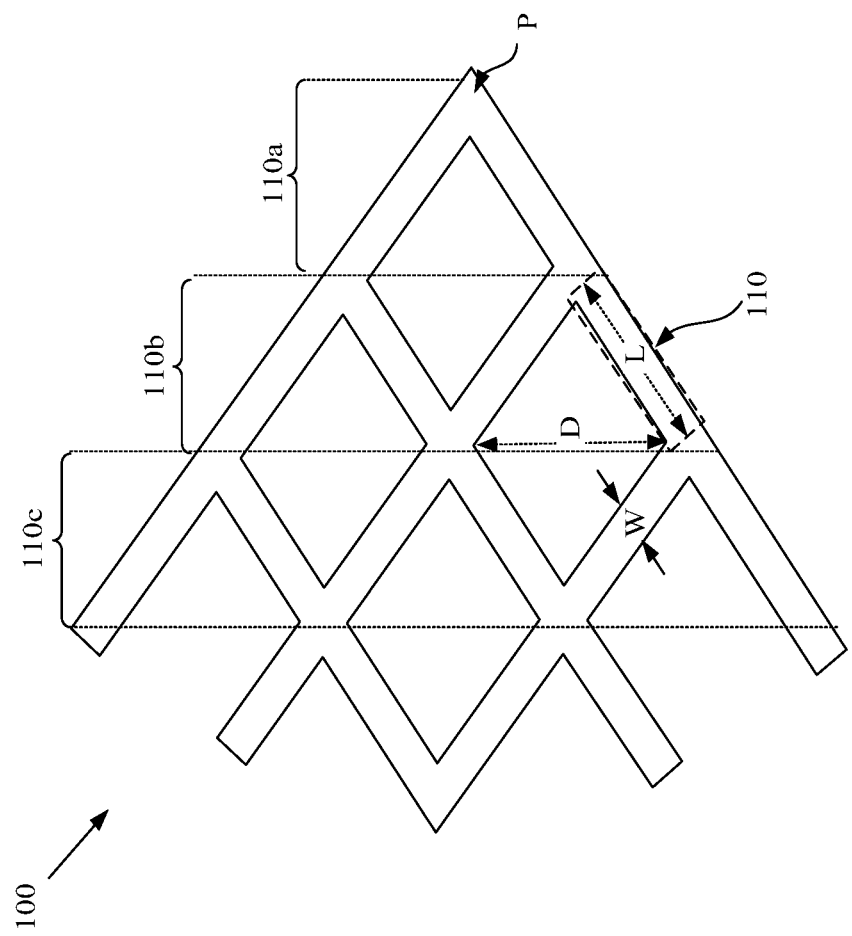
FIG. 2B is an enlarged view of a portion of the electrically programmable fuse structure of FIG. 2A.

FIG. 2A schematically illustrates an electrically programmable fuse structure according to some embodiments of the present disclosure, and FIG. 2B is an enlarged view of a portion of the electrically programmable fuse structure of FIG. 2A. As shown in FIGS. 2A and 2B, the electrically programmable fuse structure includes a cathode 100 and a fuse link 200. The cathode 100 is connected to one end of the fuse link 200 at a junction P. The electrically programmable fuse structure also includes an anode 300. The anode 300 is connected to the other end of the fuse link 200. The cathode 100 may be made of, for example, a metal. The fuse link 200 may be made up of one layer or laminated layers. Materials from which the fuse link 200 can be fabricated may include metals. In other words, the fuse link 200 may be made up of one metal layer or laminated metal layers. The formation of the fuse link 200 may be performed on a metal interconnect layer M1, M2 or M3 of a back-end of line (BOL) process.

Still referring to FIGS. 2A and 2B, the cathode 100 includes a plurality of conductive branches 110. During programming of the electrically programmable fuse structure, electron flows in the conductive branches 110 converge at the junction P connecting the cathode 100 and the fuse link 200 and then enter the fuse link 200. In some embodiments, the cathode 100 has power terminals S. The power terminals S are configured to connect to a power source for creating electron flows in the cathode 100 and for causing the electron flows to pass from the power terminals S to the junction P. The power terminals S may be provided on the conductive branches 110 farthest from the junction P in the direction of the electron flows. In some embodiments, the conductive branches 110 in the cathode 100 are arranged to form a converging side and a diverging side. The diverging side of the cathode 100 is connected to the converging side thereof. The converging side is connected to the fuse link 200 at the junction P. In some embodiments, at least two adjacent ones of the conductive branches 110 form an angle of greater than 0° and smaller than or equal to 90° at the junction P on the converging side.

Therefore, during programming of the electrically programmable fuse, an electron flow in the cathode 100 is divided into multiple flows distributed in the multiple conductive branches 110, allowing the cathode 100 to withstand a greater flow of electrons. In other words, compared to the structures of traditional cathodes, the cathode 100 in the disclosure can be applied with a greater flow of electrons due to its capability of dividing an electron flow into branches. Based on such an increased maximum permissible current of the cathode 100, a greater flow of electrons and hence a greater electron flow density gradient can be generated at the junction P where the electrons from the cathode 100 converge. This can improve the efficiency of electromigration in the portion of the fuse link 200 in the vicinity of the junction P and hence facilitate blowing of the fuse link 200 at the junction P due to the electromigration, thereby lowering the risk of rupture of the fuse link 200 due to an excessive temperature. For example, the fuse link 200 may blow by the action of electromigration before it reaches the critical temperature, i.e., the highest temperature it can withstand. In this way, the fuse link 200 can be prevented from reaching the critical temperature, which is a prerequisite to its rupture. Further, as the resistance of the fuse link 200 becomes unstable and unreliable when it ruptures, the electrically programmable fuse structure according to this disclosure also improves resistance reliability of the fuse link 200 by avoiding its rupture.

In addition to dividing the electron flow, the multiple conductive branches 110 can also facilitate heat dissipation of the cathode 100, thereby enabling the cathode 100 to keep a lower temperature than that of the traditional cathodes during programming. Furthermore, a greater temperature gradient can be achieved around the junction P connecting the cathode 100 and the fuse link 200, which further facilitates the electromigration and accelerates the blowing of the fuse link 200 in the aforementioned portion near the junction P.

In some embodiments, the conductive branches 110 are continuous and linear, and each of the conductive branches 110 has an electron flow permissible value constant throughout the conductive branch. Alternatively, each of the conductive branches 110 can be considered as a continuous linear conductor having only one current input terminal and one current output terminal. Furthermore, the widths W of the conductive branches in the cathode 100 may be the same or nearly the same. For example, each of the conductive branches 110 has the same or nearly the same cross-sectional area perpendicular to the direction of the electron flows.

For example, the widths W of the conductive branches 110 are greater than or equal to twice a specified minimum line width or a specified feature size. The lengths L of the conductive branches are, for example, greater than or equal to four times the specified minimum line width or the specified feature size. Hereinafter, the "specified feature size" or the "specified minimum line width" refers to the smallest line width that can be produced by a photolithography process used to fabricate the fuse structure. For example, if a photolithography process is required to fabricate features with a line width smaller than the smallest line width feasible for the process, it is very likely to expect inconsistent shapes and inconsistent line widths of the resulting features. Therefore, during integrated circuit (IC) layout design, a feature size or a minimum line width is to be specified based on the actual process conditions to ensure reliable semiconductor device performance.

Additionally, at least two of the conductive branches 110 in the cathode 100 are connected to the junction P (i.e., at least two of the conductive branches 110 intersect at the junction P). As a result, during programming of the electrically programmable fuse structure, the electron flows in these conductive branches 110 connected to the junction P can converge at the junction P. For example, as shown in FIGS. 2A and 2B, in the electrically programmable fuse structure according to this disclosure, two of the conductive branches 110 in the cathode 100 are connected to the junction P.

As at least two of the conductive branches 110 are connected to the junction P, a converging point may be formed at the junction P for the multiple electron flows to converge at the junction P. This results in an increased electron flow density gradient around the junction P, facilitating the electromigration in the portion of the fuse link 200 near the junction P and ensuring the fuse link 200 to blow near the junction P by the action of electromigration before the fuse link 200 reaches its critical temperature.

In some embodiments, the multiple conductive branches 110 in the cathode 100 may be divided into N branch groups, where N is a positive integer greater than or equal to 1. The conductive branches 110 in the first branch group 110a are connected to the junction P, and the conductive branches 110 in an N-th branch group are connected to the conductive branches 110 in the (N−1)-th branch group, and so on.

As shown in FIGS. 2A and 2B, only part of the multiple conductive branches 110 according to the embodiments are schematically illustrated. For example, only three branch groups are shown in FIG. 2B, i.e., the first branch group 110a containing two conductive branches 110 connected directly to the junction P, a second branch group 110b containing four conductive branches 110 connected directly to the conductive branches 110 in the first branch group 110a, and a third branch group 110c containing six conductive branches 110 connected directly to the conductive branches 110 in the second branch group 110b. In practice, the number of the conductive branches 110 may be increased according to the actual needs. For example, the structure of the conductive branches 110 may be expanded in the direction away from the fuse link 200.

In this arrangement, during the programming of the electrically programmable fuse structure, the electron flows may pass through the conductive branches 110 of the N-th branch group, the conductive branches 110 of the (N−1)-th branch group, the conductive branches 110 of an (N−2)-th branch group, . . . , and step by step to the conductive branches 110 of the first branch group 110a, and converge at the junction P.

In some embodiments, among the N branch groups in the cathode 100, the number of the conductive branches 110 in the N-th branch group is greater than the number of the conductive branches 110 in the (N−1)-th branch group. For example, the number of the conductive branches 110 in the third branch group 110c is greater than the number of the conductive branches 110 in the second branch group 110b. The number of the conductive branches 110 in the second branch group 110b is greater than the number of the conductive branches 110 in the first branch group 110a.

In some embodiments, the electron flows in the N-th branch group can be considered as branches of those in the (N−1)-th branch group. As the overall amount of the electron flows is constant, the electron flow density in the (N−1)-th branch group is greater than that in the N-th branch group. In other words, the numbers of the conductive branches 110 in the N branch groups of the cathode 100 form a gradient distribution, creating an ascending electron flow density gradient from the N-th branch group to the first branch group 110a during programming of the electrically programmable fuse structure.

For example, as the electrons in the cathode 100 flow into the fuse link 200, they converge one or more times from the N-th branch group to the first branch group 110a, and each convergence is accompanied by a change in the electron flow density, creating a stepwise ascending electron flow density gradient in the cathode 100. In this way, the impact on the junction P can be effectively alleviated when the electron flows from the cathode 100 converge at the junction P.

Of course, an ascending electron flow density gradient resulting from convergence of the electron flows may be alternatively created in the cathode 100 by adjusting the effective width profile of the cathode 100. Herein, the effective width refers to the total of the widths of the portions of the cathode 100 which contain the electron flows. The electron flow density gradient can ascend either gradually or stepwise.

For example, the effective width of the cathode 100 may decrease in the direction of electron flows toward the junction P, so that the density of the electron flows in the cathode 100 increases as the electron flows move toward the junction P during programming of the electrically programmable fuse structure. In some embodiments, the cathode 100 is provided with the power terminals S. Therefore, it can be considered that the effective width of the cathode 100 decreases from the power terminals S of the cathode 100 to the junction P so that the density of the electron flows in the cathode 100 increases as the electron flows move from the power terminals S of the cathode 100 to the junction P during programming of the electrically programmable fuse structure.

Referring to FIGS. 2A and 2B, the multiple conductive branches 110 in the cathode 100 form a mesh structure, and the number of the mesh openings of the mesh structure decreases in the direction approaching the junction P (i.e., in the direction from the power terminals S to the junction P). Herein, the conductive branches 110 can be considered as mesh lines defining the openings. For example, there is one opening connecting to the junction P, and the number of openings increases from 2 to 3, to 4, . . . , to N, etc. in sequence along the direction away from the junction P. With the number of openings is increasing, the effective width increases as well.

Only part of the mesh structure is shown in FIGS. 2A and 2B, and in practice, the mesh structure may be expanded in the direction away from the fuse link 200 by adding more meshing openings according to the actual needs.

Further, the openings in the mesh structure of the cathode 100 may have a rhombic, rectangular, circular or irregular shape. As described above, the conductive branches 110 may be considered as the mesh lines defining the openings. Therefore, with regard to rectangular or rhombic openings, each of the openings is defined by four conductive branches 110. For example, the openings in the mesh structure are rectangular (e.g., the conductive branches 110 forming the openings intersect at right angles) or rhombic, and a vertex of the opening closest to the junction P couples to the junction P. Additionally, the shortest diagonals of the openings in the mesh structure have the length D that is greater than or equal to four times a specified minimum line pitch. Herein, the "specified minimum line pitch" refers to the smallest distance between two adjacent lines that can be achieved by the photolithography process used to fabricate the fuse structure. For example, if a photolithography process is required to fabricate a plurality of line features with a pitch smaller than the smallest line pitch feasible for the process, the resulting adjacent lines are easily caused not to be distinctly separated from each other due to their inconsistent shapes. Therefore, during IC layout design, a minimum line pitch is to be specified based on the actual process conditions to ensure reliable semiconductor device performance.

Further, in some embodiments, only some of the conductive branches 110 in the cathode 100 are directly connected to the junction P. However, in other embodiments, all of the conductive branches 110 in the cathode 100 may be connected to the junction P and extend toward the direction away from the fuse link 200. For example, the cathode 100 is a divergent structure resembling an umbrella or the like.

In some embodiments, the cathode 100 may be a symmetrical structure of which an axis of symmetry may be along a longitudinal direction of the fuse link 200. For example, referring to FIGS. 2A and 2B, the mesh structure of the cathode 100 according to this disclosure is a symmetrical structure. The divergent structure resembling an umbrella or the like in the alternative embodiments may also be a symmetrical structure.

Further, in some embodiments, the cathode 100 and the fuse link 200 may be formed in the same structural layer so that the cathode 100 and the fuse link 200 can be directly connected to each other physically. In other embodiments, the cathode 100 and the fuse link 200 may be formed in different structural layers. For example, the cathode 100 is electrically connected to the fuse link 200 by a conductive plug 400 provided at the junction P connecting the cathode 100 and the fuse link 200. The conductive plug 400 may be fabricated from the same material as the fuse link 200.

When the cathode 100 and the fuse link 200 are formed in the different layers and electrically connected to each other by the conductive plug 400, during programming of the electrically programmable fuse structure, the electron flows in the cathode 100 converge at the junction P into a resulting electron flow which deflects into the fuse link 200 through the conductive plug 400. In other words, the path of the electron flow is not linear, but zigzag. The electron flow density gradient more easily becomes greater at corners of this zigzag path. Therefore, as the zigzag path is created just at the junction P, the electron flow density gradient in the portion of the fuse link 200 around the junction P can be magnified, and the fuse link 200 can blow more efficiently at the junction P through the action of electromigration.

In some embodiments, the conductive plug 400 may be further connected to the power terminals S. Thus, an electron flow can also be present in the conductive plug 400 and enter the fuse link 200 via the junction P. This can increase the instantaneous electron flow at the junction P and further magnify the electron flow density gradient in the portion of the fuse link 200 around the junction P.

Furthermore, the length of the fuse link 200 may be determined based on the Blech constant and the electron flow density of the fuse link 200. The Blech constant of a given conductor determines whether a Blech effect is possible therein (i.e., when a characteristic value of the conductor is lower than the Blech constant, electromigration will not occur in the conductor). For example, when the production of an electron flow density I of the conductor and its length J exceeds the Blech constant C thereof (i.e., I×J>C), electromigration is possible. Therefore, the minimum length of the fuse link 200 permitting the occurrence of electromigration can be determined based on the Blech constant and the electron flow density of the fuse link 200. For example, the length of the fuse link 200 may be designed to be greater than the product of the Blech constant and the electron flow density. Further, the fuse link 200 may have a width that is smaller than or equal to the widths of the conductive branches 110 and greater than or equal to the specified minimum line width or the specified feature size.

In some embodiments, a cathode of the present disclosure is a comb-like or dendritic structure which may similarly be a symmetrical structure of which the longitudinal direction of the fuse link serves as the axis of symmetry.

Figure 3A:
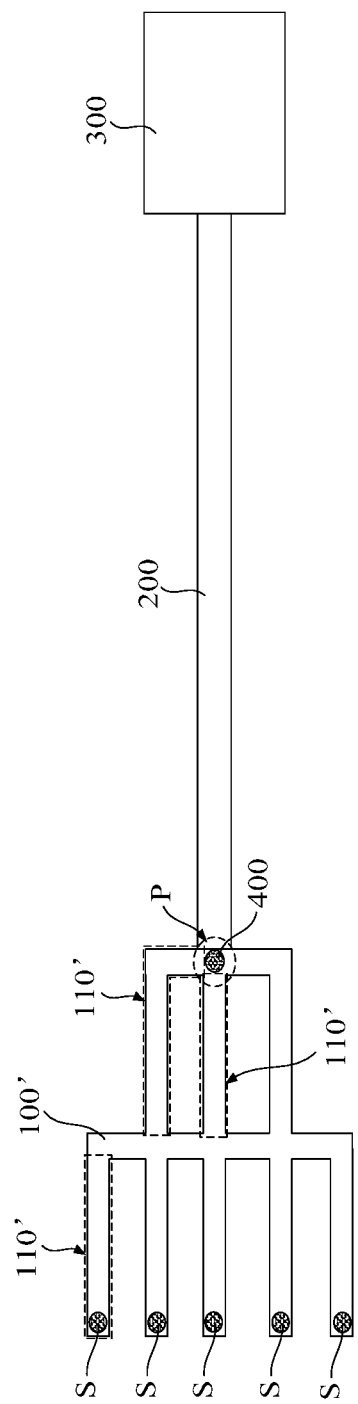
FIG. 3A schematically illustrates an electrically programmable fuse structure according to other embodiments of the present disclosure.
Figure 3B:
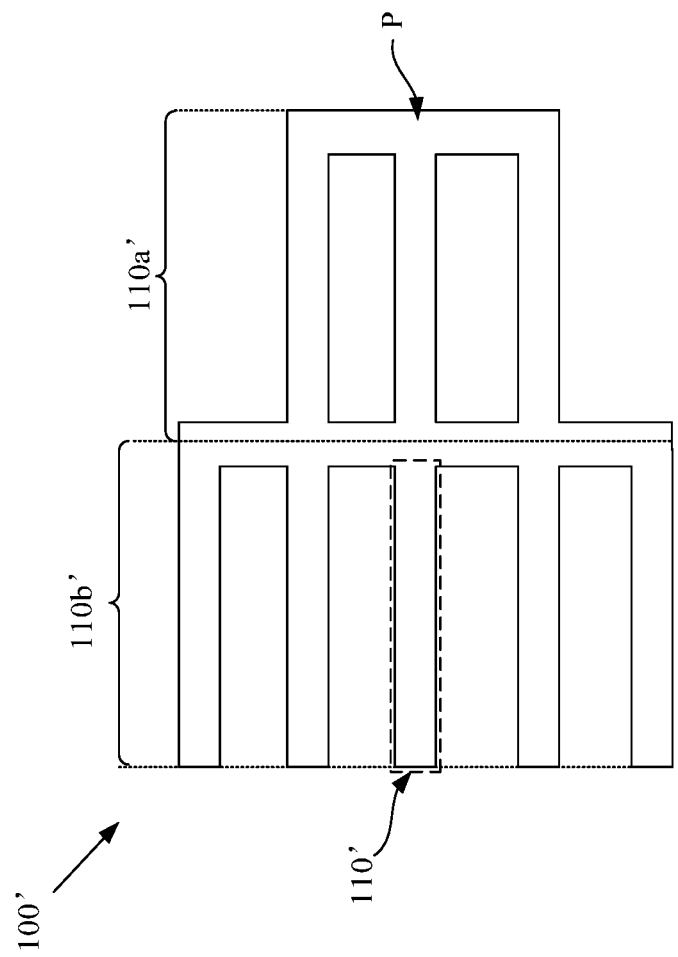
FIG. 3B is an enlarged view of a portion of the electrically programmable fuse structure of FIG. 3A.

FIG. 3A schematically illustrates an electrically programmable fuse structure according to the other embodiments of the present disclosure, and FIG. 3B is an enlarged view of a portion of the electrically programmable fuse structure of FIG. 3A. As shown in FIGS. 3A and 3B, the cathode 100' according to the embodiments also include a plurality of conductive branches 110', which can be divided into N branch groups, including the first branch group 110a' containing conductive branches 110' connected to a junction P, and the N-th branch group containing conductive branches 110' connected to the conductive branches 110' in the (N−1)-th branch group. Additionally, in the N branch groups, the number of conductive branches 110' increases from the first branch group 110a' to the N-th branch group.

For example, the first branch group 110a' contains three conductive branches 110' all connected to the junction P. The second branch group 110b' has five conductive branches 110' connected to the conductive branches 110' in the first branch group 110a'. Similarly, FIGS. 3A and 3B only show part of the branch groups and part of the conductive branches 110'. In practice, other branch groups may be connected to the second branch group 110b' to expand the structure of the cathode 100'.

Referring to FIG. 3B, each of the branch groups has a comb-like structure in which the conductive branches 110' extend in the same direction and at least partially parallel to one another. Moreover, adjacent conductive branches 110' may be spaced apart by a distance greater than or equal to four times the specified minimum line pitch.

Further, in the N branch groups, the numbers of conductive branches 110' in the N branch groups forms a gradient distribution, resulting in a gradient distribution of the effective widths of the N branch groups. For example, the effective width of the N-th branch group is greater than that of the (N−1)-th branch group, causing the effective widths of the electron flows to stepwise descend from the N-th branch group to the first branch group 110a'. As a result, during programming of the electrically programmable fuse structure, the electron flow density stepwise ascends from the N-th branch group to the first branch group 110a' in the cathode 100'.

Referring to FIG. 3A, similar to the embodiments described above, the cathode 100' may have power terminals S. The power terminals S are configured to connect to a power source for creating electron flows in the cathode 100' from the power terminals S to the junction P. The power terminals S may be provided on the conductive branches 110' farthest from the junction P in the direction of the electron flows.

Based on the above electrically programmable fuse structures, the present disclosure also provides a semiconductor device including one of the electrically programmable fuse structures. For example, the semiconductor device may be a memory, in particular a dynamic random access memory.

The memory may further include a memory cell. In some embodiments, the electrically programmable fuse structure may constitute part of the memory cell and used for data storage. For example, the electrically programmable fuse structure may have a low initial resistance before it is programmed. During the programming, a large current may be applied to blow the fuse link. As a result, the resistance of the electrically programmable fuse structure may be multiplied and the blown fuse link is permanently open-circuited, with other possible fuse links in the memory remaining intact and conductive. In this way, in the memory cell constituted by the electrically programmable fuse structure, the state of whether the fuse link is blown can represent a datum stored thereon. In other words, a datum can be stored in the memory by blowing the fuse link or not.

Of course, the electrically programmable fuse structure may also be used to electrically connect a memory cell. For example, with the continuous development of technologies in the field of semiconductor devices, the integration and manufacturing cost of chips are ever increasing. On the other hand, as process nodes continue to shrink, chips are increasingly prone to defects, which can lead to a decline in the yield. In order to improve the yield, redundant circuits may be added to the chips for replacing defective ones. To this end, fuses are usually added to IC chips, which can be blown to enable switching to the redundant circuits. In this way, the electrically programmable fuse structure can be electrically connected to a memory cell, and when the memory cell begins to malfunction, the fuse link can be blown to switch to a redundant memory cell.

In summary, in the electrically programmable fuse structures according to the present disclosure, as the conductive branches of the cathode divide an electron flow in the cathode into multiple branches, the cathode can withstand a greater electron flow. As a result, a greater electron flow density gradient is allowed around the junction connecting the cathode and the fuse link, which can accelerate electromigration in a portion of the fuse link near the junction. Moreover, the multiple conductive branches can also facilitate heat dissipation of the cathode, resulting in a lower temperature of the cathode and a greater temperature gradient around the junction connecting the cathode and the fuse link. Under the joint effect of both the electron flow density gradient and the temperature gradient, the electromigration in the portion of the fuse link near the junction can be further speeded up so that the fuse link can blow by the action of electromigration before it rises to an excessive temperature which may cause the fuse link to rupture.

The embodiments disclosed herein are described in a progressive manner, with the description of each embodiment focusing on its differences from other embodiments. Reference can be made between the embodiments for their identical or similar parts.

The description presented above is merely that of a few embodiments of the present disclosure and does not limit the scope thereof in any sense. Any and all changes and modifications made by those of ordinary skill in the art based on the above teachings fall within the scope as defined in the appended claims.

The invention claimed is:

1. An electrically programmable fuse structure, comprising a cathode, a fuse link and an anode, the fuse link connecting the cathode to the anode, the cathode connected to the fuse link at a junction, wherein
the cathode comprises a plurality of conductive branches arranged to form a converging side and a diverging side, and the converging side of the cathode is connected to the junction so as to be connected to the fuse link.

2. The electrically programmable fuse structure of claim 1, wherein during programming of the electrically programmable fuse structure, electron flows in the plurality of conductive branches converge at the junction connecting the cathode and the fuse link and enter the fuse link.

3. The electrically programmable fuse structure of claim 2, wherein the cathode comprises a power terminal configured to be connected to a power source, and the power terminal is provided on one of the plurality of conductive branches farthest from the junction in a direction of the electron flows.

4. The electrically programmable fuse structure of claim 1, wherein at least two of the plurality of conductive branches in the cathode are connected to the junction, and electron flows in the at least two conductive branches converge at the junction during programming of the electrically programmable fuse structure.

5. The electrically programmable fuse structure of claim 4, wherein the plurality of conductive branches in the cathode are divided into N branch groups wherein N is a positive integer greater than or equal to 1, and wherein
conductive branches in the first branch group are connected to the junction, and conductive branches in the N-th branch group are connected to conductive branches in the (N−1)-th branch group, so that during programming of the electrically programmable fuse structure, electron flows pass from the conductive branches in the N-th branch group through the conductive branches in the (N−1)-th branch group, step by step to enter the conductive branches in the first branch group, and converge at the junction.

6. The electrically programmable fuse structure of claim 5, wherein the number of the conductive branches in the N-th branch group is greater than the number of the conductive branches in the (N−1)-th branch group so that during programming of the electrically programmable fuse structure, an electron flow density is increased stepwise from the N-th branch group to the first branch group in the N branch groups.

7. The electrically programmable fuse structure of claim 4, wherein the plurality of conductive branches in the cathode are all connected to the junction and extend radially away from the fuse link.

8. The electrically programmable fuse structure of claim 1, wherein the cathode has an effective width gradually decreasing in a direction of electron flows toward the junction so that during programming of the electrically programmable fuse structure, an electron flow density is increased stepwise along the direction of the electron flows toward the junction, wherein the effective width of the cathode is a total of widths of the portions of the cathode which contain electron flows.

9. The electrically programmable fuse structure of claim 8, wherein the plurality of conductive branches in the cathode form a mesh structure, the number of openings of the mesh structure decreasing in a direction toward the junction.

10. The electrically programmable fuse structure of claim 9, wherein the openings of the mesh structure are rectangular or rhombic, and a vertex of an opening in the mesh structure closest to the junction couples to the junction.

11. The electrically programmable fuse structure of claim 9, wherein the openings of the mesh structure are rectangular or rhombic, and the shortest diagonal of the openings in the mesh structure has a length greater than or equal to four times a specified minimum line pitch.

12. The electrically programmable fuse structure of claim 1, wherein the plurality of conductive branches in the cathode form a comb-like structure.

13. The electrically programmable fuse structure of claim 1, wherein the cathode is a symmetrical structure of which an axis of symmetry is along a longitudinal direction of the fuse link.

14. The electrically programmable fuse structure of claim 1, wherein the cathode and the fuse link are formed in different layers; the cathode is electrically connected to the fuse link at the junction by a conductive plug; and during programming of the electrically programmable fuse structure, electron flows in the cathode enter into the fuse link through the conductive plug, wherein the conductive plug is further connected to a power terminal.

15. The electrically programmable fuse structure of claim 1, wherein the cathode and the fuse link are formed in the same layer, and the cathode and the fuse link are physically connected to each other.

16. The electrically programmable fuse structure of claim 1, wherein at least two adjacent ones of the plurality of conductive branches form an angle of greater than 0° and smaller than or equal to 90° at the junction on the converging side.

17. The electrically programmable fuse structure of claim 1, wherein the fuse link has a width that is smaller than or equal to a width of each of the plurality of conductive branches and greater than or equal to a specified minimum line width.

18. The electrically programmable fuse structure of claim 1, wherein the plurality of conductive branches are continuous and linear, and each of the plurality of conductive branches has an electron flow permissible value constant throughout the conductive branch, wherein a width of each of the plurality of conductive branches is greater than or equal to twice a specified minimum line width, a length of each of the plurality of conductive branches is greater than or equal to four times a specified minimum line width.

19. A semiconductor device, comprising the electrically programmable fuse structure of claim 1.

20. The semiconductor device of claim 19, wherein the semiconductor device is a memory, wherein the memory comprises a memory cell to which the electrically programmable fuse structure is electrically connected.

\* \* \* \* \*